United States Patent
Yu et al.

(10) Patent No.: US 12,277,349 B2
(45) Date of Patent: Apr. 15, 2025

(54) INTERNAL CLOCK SIGNALING

(71) Applicant: Micron Technology, Inc., Boise, ID (US)

(72) Inventors: Liang Yu, Boise, ID (US); Luigi Pilolli, L'Aquila (IT); Biagio Iorio, Luco dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/622,132

(22) Filed: Mar. 29, 2024

(65) Prior Publication Data

US 2024/0241673 A1 Jul. 18, 2024

Related U.S. Application Data

(63) Continuation of application No. 17/464,868, filed on Sep. 2, 2021, now Pat. No. 11,960,764.

(51) Int. Cl.
  *G06F 3/06* (2006.01)
  *G06F 1/04* (2006.01)
  *G06F 1/3234* (2019.01)

(52) U.S. Cl.
  CPC .............. *G06F 3/0659* (2013.01); *G06F 1/04* (2013.01); *G06F 3/0604* (2013.01); *G06F 3/0679* (2013.01); *G06F 1/3275* (2013.01)

(58) Field of Classification Search
  CPC .... G06F 3/0659; G06F 3/0604; G06F 3/0679; G06F 1/04; G06F 1/3275; G11C 16/0483; G11C 16/32; G11C 16/20; G11C 7/222; G11C 7/1063; G11C 8/12; Y02D 10/00
  See application file for complete search history.

(56) References Cited

U.S. PATENT DOCUMENTS

| | | | |
|---|---|---|---|
| 5,765,002 A | 6/1998 | Garner | |
| 9,417,685 B2 | 8/2016 | Ha et al. | |
| 9,620,182 B2 | 4/2017 | Tuers et al. | |
| 10,114,690 B2 | 10/2018 | Shah et al. | |
| 10,884,638 B1 | 1/2021 | Cariello et al. | |
| 11,373,710 B1 | 6/2022 | Hsu | |
| 11,385,810 B2 | 7/2022 | Lien | |
| 2015/0235677 A1* | 8/2015 | Grunzke | G11C 5/04 365/226 |
| 2015/0363342 A1 | 12/2015 | Tuers | |
| 2018/0136707 A1 | 5/2018 | Ha | |
| 2022/0199131 A1 | 6/2022 | Kim | |

* cited by examiner

*Primary Examiner* — Khoa D Doan
*Assistant Examiner* — Tong B. Vo
(74) *Attorney, Agent, or Firm* — Brooks, Cameron & Huebsch, PLLC

(57) ABSTRACT

A method includes selecting a particular ready/busy pin (R/B #) among a plurality of R/B # pins that are associated with respective memory dice among a plurality of memory dice of a memory device. The method further includes receiving, by at least one memory dice among the plurality of memory dice, signaling indicative of performance of a memory access while the particular R/B # pin is set to low, and, initiating an internal clocking signal subsequent to receipt of the signaling indicative of performance of the memory access, wherein the internal clocking signal is associated with timing of operations performed by the plurality of memory dice.

20 Claims, 6 Drawing Sheets

INTERNAL CLOCK SIGNALING

PRIORITY INFORMATION

This application is a Continuation of U.S. application Ser. No. 17/464,868, filed on Sep. 2, 2021, the contents of which are incorporated herein by reference.

TECHNICAL FIELD

Embodiments of the disclosure relate generally to memory sub-systems, and more specifically, relate to internal clock signaling.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
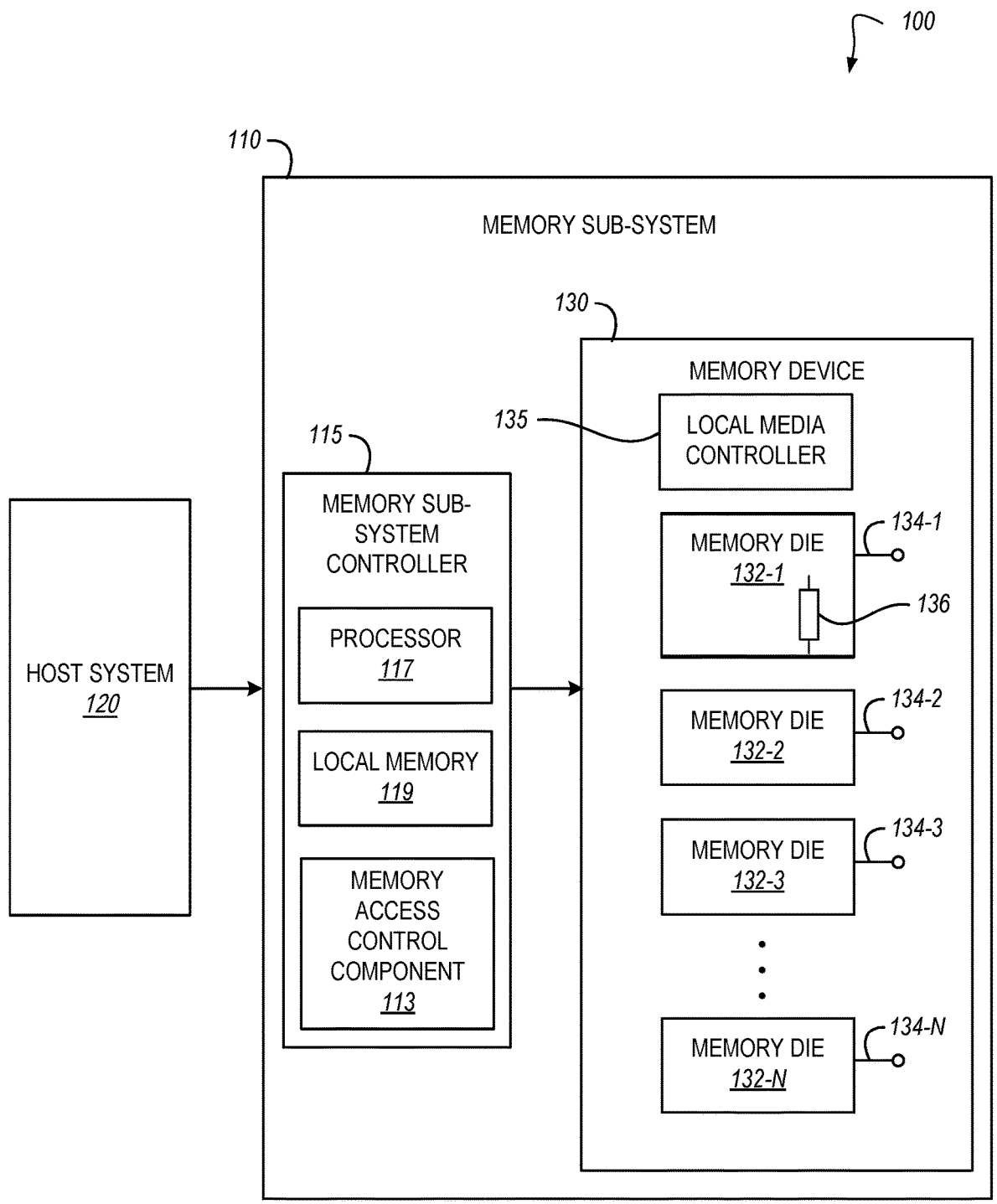
FIG. 1 illustrates an example computing system that includes a memory sub-system in accordance with some embodiments of the present disclosure.

Aspects of the present disclosure are directed to memory sub-system internal clock signaling, in particular to memory sub-systems that include a plurality of memory dice with each respective dice associated with a ready/busy pin (R/B #). A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each dice can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

During operation of a memory device, an R/B # pin can be used to indicate when the memory device is processing a program or erase operation. The R/B # pin can also be also used during a read operation to indicate when data is being transferred from an array of memory cells of the memory device into a register, such as a serial data register. The signal is typically HIGH (e.g., a logical "1" value), and transitions to LOW (e.g., a logical "0" value) after the appropriate command is written to the memory device. The open-drain driver of the signal pin can enable multiple R/B # outputs to be OR-tied. In general, some approaches require that the R/B # signal is asserted through a pull-up resistor for proper operation. In such approaches, the pull-up resistor is typically located on a printed circuit board (PCB), outside of a physical area that contains memory dice that are part of the memory device.

Generally, if the NAND memory device is performing an operation, such as a peak power management operation, signaling (e.g., an R/B # signal) is asserted on the R/B # pin to cause the R/B # pin to exhibit a LOW status. As described in more detail herein, the memory device can include multiple memory dice and each respective memory dice can be associated with a ready/busy pin. For example, each memory dice can have an R/B # pin to receive a corresponding R/B # signal for each memory dice and/or for each memory dice in a set of memory dice. This can lead to multiple R/B # signals traversing signal layers within the PCB. Further, assertion of each LOW R/B # signal can trigger an internal clock to start synchronization within the memory dice. In the inverse, assertion of each HIGH R/B # signal can trigger the internal clock to pause (e.g., to, at least temporarily, refrain from generating synchronous or asynchronous timing signals) its synchronization within the memory device in order to save power. As a result, the presence of multiple R/B # signals can create conflict within the device, causing delays in execution of memory accesses, and causing power inefficiencies within the memory dice and, ultimately, the memory device itself.

Some approaches attempt to mitigate the adverse effects of multiple R/B # signals being present concurrently in the PCB signal layers by coupling the R/B # pins associated with multiple targets (e.g., sets of memory dice that addressed by a particular channel of a memory sub-system) by effectively coupling (e.g., "shorting") the R/B # pins of all of the targets together, generally to a single internal clock circuit. Often, such approaches "short" the R/B # pins of the targets together to minimize a quantity of R/B # signals present in the signal layers of the PCB during a power up operation involving the memory device. However, such coupling of the R/B # pins involving all of the targets may not effectively mitigate the adverse effects of multiple R/B # signal pathing mentioned above. For example, approaches that rely upon an effective coupling of the R/B # pins across multiple targets may fail to account for variances in the quality of memory dice across targets, workloads of memory dice across targets, signal pathing variances across layers of the PCB on which the memory dice are disposed, and/or cross-boundary clocking variances across multiple targets, among others.

In such approaches, the R/B # pins can be effectively coupled together to "short" the R/B # pins of multiple targets, such as a set of memory dice that are provided on a single chip or integrated circuit (e.g., a NAND package). Although some such approaches contemplate coupling R/B # pins of subsets of memory dice that are part of a NAND package, reliance on signal layers of the PCB is generally employed to achieve the coupling of R/B # pins regardless of NAND package stratification. That is, in some approaches, the R/B # pins associated with individual memory dice that are grouped together as targets and provided in a NAND package generally require a physical signal path (e.g., a physical conductive path such as a signal layer of the PCB) to allow for the R/B # pins to be connected to facilitate electrical coupling to effect an electrical "short" of the R/B # pins. As a result, such approaches can require that the PCB layout is designed with these specific properties in mind. Further, because such approaches rely on PCB layout design, it may be difficult or even impossible to create different peak power management groups that consist of variable quantities of memory dice.

In addition, the approaches described above also generally rely on a pull-up resistor (e.g., a pull-up resistor that is located on the PCB) to control the magnitude of the signaling supplied to the R/B # pin(s). As these pull-up resistors are typically located on the PCB, such resistors are typically located outside of a physical area that contains, at minimum, the memory dice of a memory device. In addition, the pull-up resistors of some approaches may be directly coupled to the signal layers of the PCB in order to maintain electrical coupling to the R/B # pins. While this configuration can allow for the R/B # pins of one or more packages to be shorted together, such approaches can fail to address scenarios in which limited PCB space is available, scenarios in which coupling of R/B # pins of entire packages is inefficient, and/or scenarios in which peak power management operations are performed.

Aspects of the present disclosure address the above and other deficiencies by assigning a primary R/B # pin among multiple R/B # pins associated with the memory dice to communicate with the memory device and/or a memory sub-system. In some embodiments, four secondary R/B # pins can be employed with a fifth R/B # pin being assigned as the primary R/B # pin. The secondary R/B # pins associated with the memory dice (e.g., the four R/B # pins in this non-limiting example) can communicate to the primary R/B # pin prior to the primary R/B # pin communicating with the memory device or memory sub-system. Embodiments are not so limited, and in at least one embodiment, the primary R/B # pin can communicate with the memory device and/or a memory sub-system during an initial configuration period or during an initialization stage of the memory device and/or the memory sub-system. In such embodiments, the secondary R/B # pins can communicate with the memory device or memory sub-system subsequent to the initial configuration period or initialization stage of the memory device and/or the memory sub-system. The signal status of the primary R/B # pin, whether LOW or HIGH, can determine the initiation of the internal clock(s). The memory device can access the memory dice associated with the primary R/B # pin prior to accessing the memory dice associated with the secondary R/B # pins. In the inverse, the memory device can pause access of the memory dice associated with the secondary R/B # pins prior to pausing access of the memory dice associated with the primary R/B # pin. To conserve space on the PCB, the resistor (e.g., the pull-up resistor) for the primary R/B # memory device can be resident on a memory dice that is associated with the primary R/B #. As used herein, the term "resident on" refers to something that is physically located on a particular component. For example, the resistor being resident on the PCB refers to a condition in which the resistor is physically coupled to, or physically within the PCB. The term "resident on" may be used interchangeably with other terms such as "deployed on" or "located on," herein.

FIG. 1 illustrates an example computing system 100 that includes a memory sub-system 110 in accordance with some embodiments of the present disclosure. The memory sub-system 110 can include media, such as one or more volatile memory devices, one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory device 130 can include any combination of the different types of non-volatile memory devices and/or volatile memory devices. Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

The memory device 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 as well as convert responses associated with the memory device 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In some embodiments, the memory device 130 includes the memory dice 132-1 associated with the primary R/B # 134-1. As shown in FIG. 1, there are multiple memory dice 132-1, 132-2, 132-3 to 132-N, with each memory dice being associated with a respective of R/B # pin 134-1, 134-2, 134-2 to 134-N. One or more of the memory dice 132-1, 132-2, 132-3 to 132-N can comprise a single memory die and/or one or more of the memory dice 132-1, 132-2, 132-3 to 132-N can comprise a collection (e.g., a package) of NAND memory dice. In one embodiment, the memory device 130 includes four memory dice 132-1, 132-2, 132-3, and 132-N, with respective memory dice associated with a respective secondary R/B # pin while the primary memory dice 132-1 is associated with the primary R/B # pin 134-1. The other memory dice, 132-2, 132-3 to 132-N, which can be referred to as "secondary memory dice," can communicate with the primary memory dice 132-1 prior to the primary memory dice 132-1 communicating with the memory sub-system 110. The memory sub-system 110 can access the primary memory dice 132-1 prior to accessing the other memory dice 132-2, 132-3 to 132-N. In the inverse, the memory sub-system 110 can pause performance of memory access requests involving of the memory dice 132-2, 132-3, to 132-N prior to pausing performance of memory access requests involving the primary memory dice 132-1. However, embodiments are not so limited, and in at least one embodiment, the primary R/B # pin can communicate with the memory device and/or a memory sub-system during an initial configuration period or during an initialization stage of the memory device and/or the memory sub-system. In such embodiments, the secondary R/B # pins can communicate with the memory device or memory sub-system subsequent to the initial configuration period or initialization stage of the memory device and/or the memory sub-system.

The memory sub-system 110 can include a memory access control component 113. Although not shown in FIG. 1 so as to not obfuscate the drawings, the memory access control component 113 can include various circuitry to facilitate selection of the primary R/B # pin 134-1, assertion of R/B # signals on the R/B # pins 134, and/or sequencing of memory access requests involving the memory device 130. In some embodiments, the memory access control component 113 can include special purpose circuitry in the form of an ASIC, FPGA, state machine, and/or other logic circuitry that can allow the memory access control component 113 to orchestrate and/or perform operations to selectively perform the operations described herein.

In some embodiments, the memory sub-system controller 115 includes at least a portion of the memory access control component 113. For example, the memory sub-system controller 115 can include a processor 117 (processing device) configured to execute instructions stored in local memory 119 for performing the operations described herein. In some embodiments, the memory access control component 113 is part of the host system 110, an application, or an operating system.

In a non-limiting example, an apparatus (e.g., the computing system 100) can include a memory sub-system 110. The memory sub-system 110 can include multiple memory dice 132-1, 132-2, to 132-N. Although shown as a group of discrete memory dice 132-1 to 132-N, embodiments are not so limited and the memory device 130 can include multiple sets or groups of memory dice. Each respective memory dice can be associated with a particular read/busy pin (R/B #) among a plurality of R/B # pins 134-1 to 134-N. The memory dice 132-1, 132-2, to 132-N can be involved in a peak power management operation (e.g., selecting a primary R/B # pin, receiving signaling indicative of a memory access involving a memory dice, and initiating an internal clock). A processing device (e.g., the processor 117 and/or the local media controller 135) can be coupled to the memory device 130 and can perform operations comprising selecting a primary R/B # pin 134-1 associated with a particular memory dice (e.g., the memory dice 132-1) among the plurality of R/B # pins 134-2 to 134-N that are associated with respective memory dice 132-1, 132-2 to 132-N. For example, the memory dice 132-1 can serve as the primary memory dice and can be associated with a primary R/B # pin 134-1 while the secondary memory dice, 132-2, 132-3, to 132-N can be associated with respective secondary R/B # pins 134-2 to 134-N. The processing device can receive, from at least one memory dice 132-1, 132-2, to 132-N, signaling indicative of performance of a memory access while the primary R/B # pin is set to LOW. The processing device can receive the signaling indicating the memory access through a resistor 136 that is resident on at least one of the memory dice 132-1, 132-2, to 132-N. In some embodiments, the primary R/B # pin 134-1 can be set to a LOW status through the performance of the memory access involving the memory dice 132-1, 132-2, to 132-N.

The processing device can commence performance of the memory access involving the memory dice 132-2, to 132-N (e.g., the secondary memory dice) that are associated with respective secondary R/B # pins 134-2 to 134-N after commencing performance of the memory access involving the memory dice 132-1 having the primary R/B # pin 134-1 associated therewith. For example, the memory dice 132-1 having the primary R/B # pin 134-1 can be accessed prior to accessing the secondary memory dice, 132-2 to 132-N having the secondary R/B # pins 134-2 to 134-N associated therewith. In this example, the processing device can receive signaling indicative of performance of the memory access for the secondary R/B # pins 134-2 to 134-N after signaling indicative of performance of the memory access for the primary R/B # pin 134-1 has been received. When a memory access involving respective dice of the secondary memory dice, 132-2 to 132-N, is complete, the primary R/B # pin 134-1 can be set to HIGH. When the primary R/B # pin 134-1 is set to high, performance of the memory access may be paused. However, the inverse order is used in pausing performance of the memory access. For example, the processing device can pause performance of the memory access involving of secondary memory dice, 132-2 to 132-N, associated with the secondary R/B # pins 134-2 to 134-N prior to pausing performance of the memory access involving the memory dice 132-1 associated with the primary R/B # pin 134-1. In some embodiments, an internal clock signal can be initiated subsequent to receipt of the signaling indicative of performance of the memory access. The internal clocking signal can be associated with timing of operations performed by the memory dice 132-1, 132-2, to 132-N. The internal clock signal associated with timing of operations for the memory dice 132-1, 132-2, to 132-N can, in some embodiments, be initiated only responsive to the primary R/B # pin 134-1 being set to a LOW power status. As such, the processing device can check the power status of the primary R/B # pin 134-1 prior to the performance of the memory access involving the memory dice 132-1, 132-2, to 132-N.

In one non-limiting example, the primary R/B # pin 134-1 is set to a LOW power status during the performance of the memory access of the memory dice, 132-1, 132-2, to 132-N. The processing device can receive, by at least one of the memory dice, 132-1, 132-2, to 132-N, a signal indicating performance of the memory access of the memory dice 132-1 associated with the primary R/B # pin 134-1. The processing device can then receive, by the at least one of the memory dice, 132-1, 132-2, to 132-N, signaling indicative of performance of the memory access involving a first memory dice (e.g., the memory dice 132-1). The processing device can further receive, by the at least one of the memory dice, 132-1, 132-2, to 132-N, signaling indicative of performance of the memory access involving a second memory dice (e.g., the memory dice 132-2). Subsequent to performance of the memory access of the first memory dice (e.g., the memory dice 132-1), a first internal clocking signal can be initiated. For example, a first internal clocking signal can be initiated subsequent to signaling indicative of completion of performance of the memory access of the first memory dice (e.g., the memory dice 132-1). Subsequent to performance of the memory access of the second memory dice (e.g., the memory dice 132-2), a second internal clocking signal can be initiated. For example, a second internal clocking signal can be initiated subsequent to receipt of signaling indicative of completion of the performance of the memory access of the second memory dice (e.g., the memory dice 132-2). In some embodiments, the processing device can simultaneously commence operation of the first memory dice (e.g., the memory dice 132-1) and the second memory dice (e.g., the memory dice 132-2). For example, performance of the memory access of the first memory dice (e.g., the memory dice 132-1) and the second memory dice (e.g., the memory dice 132-2) can occur concurrently (or substantially concurrently), such that the completion of the memory access of the first memory dice and the second memory dice can occur concurrently thereby causing the initiation of the first internal clocking signal and the second clocking signal concurrently (or substantially concurrently). As used herein, the term "substantially" intends that the characteristic needs not be absolute, but is close enough so as to achieve the advantages of the characteristic. For example, "substantially concurrently" is not limited to absolute concurrently and can include timings that are intended to be concurrent but due to manufacturing limitations may not be precisely concurrently. For example, due to read/write delays that may be exhibited by various interfaces (e.g., DDR vs PCIe) a memory access (e.g., a read or write operation) that is performed "substantially concurrently" may not finish at exactly the same time. For example, the operation may complete at a time that is close enough so as to function such that the data transfers are completed at a close point in time. However, in some embodiments, the initiation of the first internal clocking signal and the second clocking signal may be commenced at a same time such that the initiation of the first internal clocking signal and the second clocking signal at a point in time that is substantially concurrent.

In some embodiments, signaling indicative of performance of the memory access involving the memory dice 132-1, 132-2, to 132-N is received independently on different physical channels of the memory sub-system 110 and so the memory dice 132-1, 132-2, to 132-N can be accessed by the processing device concurrently. For example, the processing device can receive signaling indicative of performance of the memory access involving the memory dice 132-1, 132-2, to 132-N concurrently. The memory dice 132-1, 132-2, to 132-N and their respective R/B # pins 134-1, 134-2, to 134-N can also function exclusive of each other. For example, the processing device can receive signaling indicative of performance of the memory access involving the memory dice 132-1, 132-2, to 132-N and the respective R/B # pins 134-1, 132-4, to 134-N exclusive of each other.

In another non-limiting example, a system (e.g., the computing system 100) can include a memory sub-system 110 comprising a plurality of memory components (e.g., a plurality of dice 132-1, 132-2, to 132-N within the memory device 130) that share a peak power management characteristic. In this example, each memory component (e.g., memory dice 132-1) can be associated with a particular R/B # pin (e.g., R/B # pin 134-1) among a plurality of R/B # pins 134-2 to 134-N. A processing device (e.g., the processor 117 and/or the local media controller 135) can be coupled to the memory components and can perform operations comprising selecting a particular R/B # pin (e.g., R/B # pin 134-1) from the plurality of R/B # pins 134-1, 132-4, to 134-N to have a singular status for the plurality of memory components. The processing device can further receive, by at least one memory dice (e.g., memory dice 132-1) among a plurality of memory dice 132-1, 132-2, to 132-N, signaling indicative of performance of a memory access involving a first memory component (e.g., memory dice 132-1) of the plurality of memory components, (e.g., the memory dice 132-1, 132-2, to 132-N). The processing device can further receive, by the at least one memory dice (e.g., memory dice 132-1) among the plurality of memory dice 132-1, 132-2, to 132-N, signaling indicative of performance of a memory access involving a second memory component (e.g., memory dice 132-2) of the plurality of memory components responsive to signaling indicative of completion of the performance of a memory access involving the first memory component (e.g., memory dice 132-1) of the plurality of memory components. Subsequent to signaling indicative of the completion of the performance of a memory access involving the plurality of memory components an internal clock may be initiated. The processing device can stagger performance of the memory access of the plurality of memory components such that the second memory component (e.g., memory dice 132-2) of the plurality of memory components commences performance of the memory access at a delayed time than the performance of the memory access involving the first memory component (e.g., memory dice 132-1). For example, the processing device may commence performance of the memory access involving the second memory component (e.g., memory dice 132-2) after the memory access of the first memory component (e.g., memory dice 132-1) has commenced.

Figure 2:
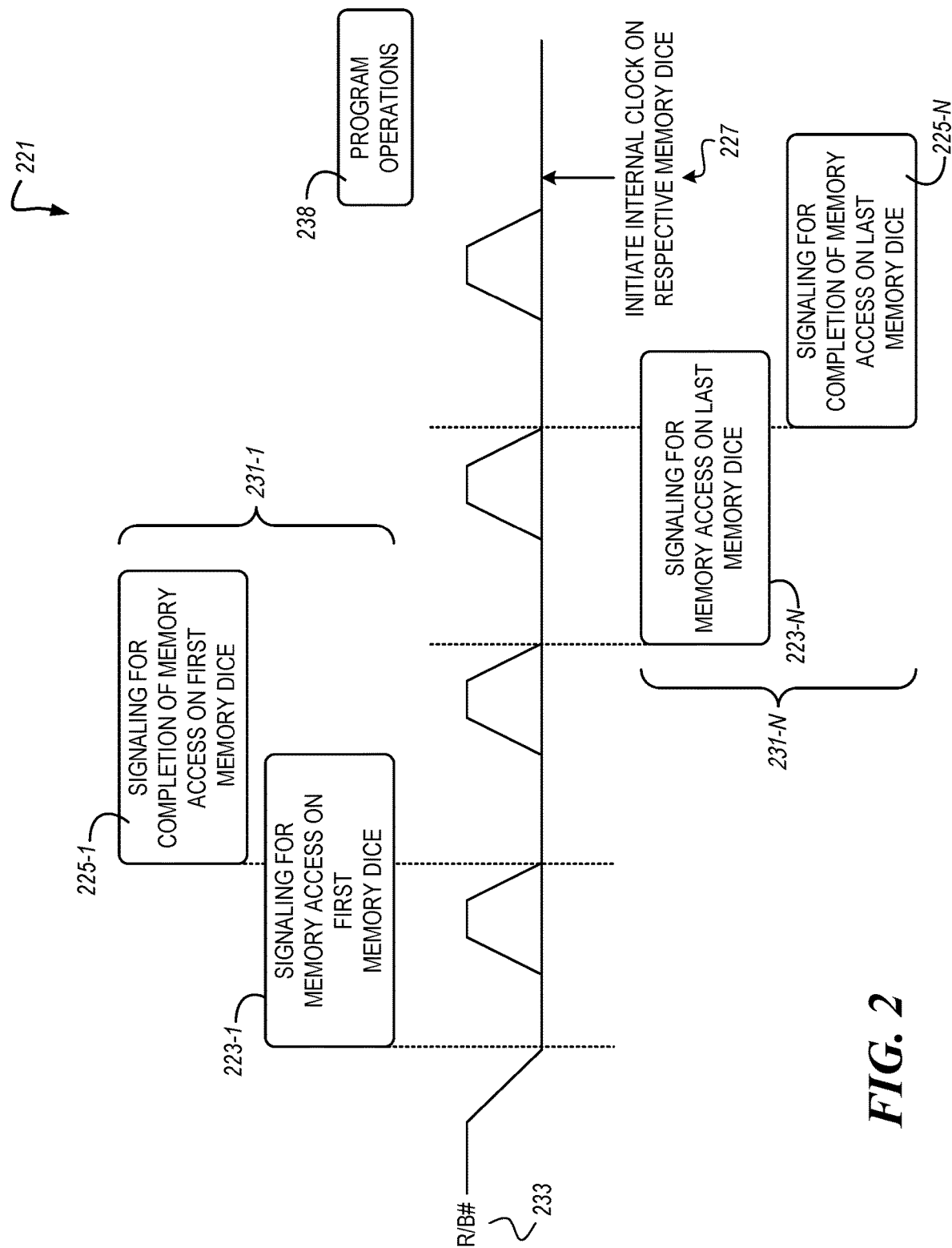
FIG. 2 is a timing diagram corresponding to memory sub-system internal clock signaling in accordance with some embodiments of the present disclosure.

FIG. 2 is a timing diagram 221 corresponding to memory sub-system internal clock signaling in accordance with some embodiments of the present disclosure. Operations as described herein can occur at time stamps illustrated by the dashed lines. Memory dice group 1 231-1 consists of multiple memory dice (e.g., at least a portion of the memory dice 132-1 to 132-N illustrated in FIG. 1, herein) and is associated with respective R/B # pins (e.g., at least a portion of the R/B # pins 134-1 to 134-N illustrated in FIG. 1, herein). Memory dice group 2 231-N consists of a plurality of memory dice (e.g., at least a portion of the memory dice 132-1 to 132-N illustrated in FIG. 1, herein) and is associated with respective R/B # pins (e.g., at least a portion of the R/B # pins 134-1 to 134-N illustrated in FIG. 1, herein). However, embodiments are not so limited and, although not illustrated in FIG. 2, greater than two memory dice groups or fewer than two memory dice group are contemplated within the disclosure. As described above, a primary R/B # pin 233 can be chosen from the R/B # pins (e.g., at least a portion of the R/B # pins 134-1 to 134-N illustrated in FIG. 1, herein) associated with the memory dice groups 231-1 to 231-N.

At operation 223-1, a processing device (e.g., processor 117 in FIG. 1) can receive, by at least one memory dice among a plurality of memory dice within memory dice group 1 231-1, signaling indicative of performance of a memory access of a first memory component (e.g., memory dice group 1 231-1) of the plurality of memory dice groups. At operation 225-1, the processing device can receive, by at least one memory dice among the plurality of memory dice within memory dice group 1 231-1, signaling indicative of the completion of the performance of the memory access of memory dice group 1 231-1. In some embodiments, when memory access of memory dice group 1 231-1 is complete, the primary R/B # pin 233 can be set to high. When the primary R/B # pin is set to high, performance of another memory access may be paused. Although not illustrated, a plurality of memory access operations may occur between 223-1 and operation 225-1 within memory dice group 1 231-1.

At operation 223-N, the processing device can receive, by at least one memory dice among a plurality of memory dice within memory dice group 2 231-N, signaling indicative of performance of a memory access of a last memory component (e.g., memory dice group 2 231-N) of the plurality of memory dice groups. At operation 225-N, the processing device can receive, by at least one memory dice among the plurality of memory dice within memory dice group 2 231-N, signaling indicative of the completion of the performance of the memory access of memory dice group 2 231-N. In some embodiments, when memory access of memory dice group 2 231-N is complete, the primary R/B # pin 233 can be set to high. When the primary R/B # pin is set to a high power status, performance of another memory access may be paused. Although not illustrated, a plurality of memory access operations may occur between operation 223-1 and operation 225-1 within memory dice group 2 231-N.

At operation 227 the processing device can initiate an internal clocking signal within memory dice group 1 231-1 and memory dice group 2 231-N subsequent to receiving an indication of completion of the performance of the memory access of the plurality of memory components. For example, the processing device can initiate an internal clocking signal within memory dice group 1 231-1 and memory dice group 2 231-N subsequent to operation 225-N. The internal clock signal for the plurality of memory components can be initiated only when primary R/B # pin 233 is set to a low power status. For example, when the primary R/B # pin is set to a high power status, the internal clock signal cannot be initiated. At operation 238, the processing device can resume program operations while the internal clock has been initiated in operation 227.

Figure 3:
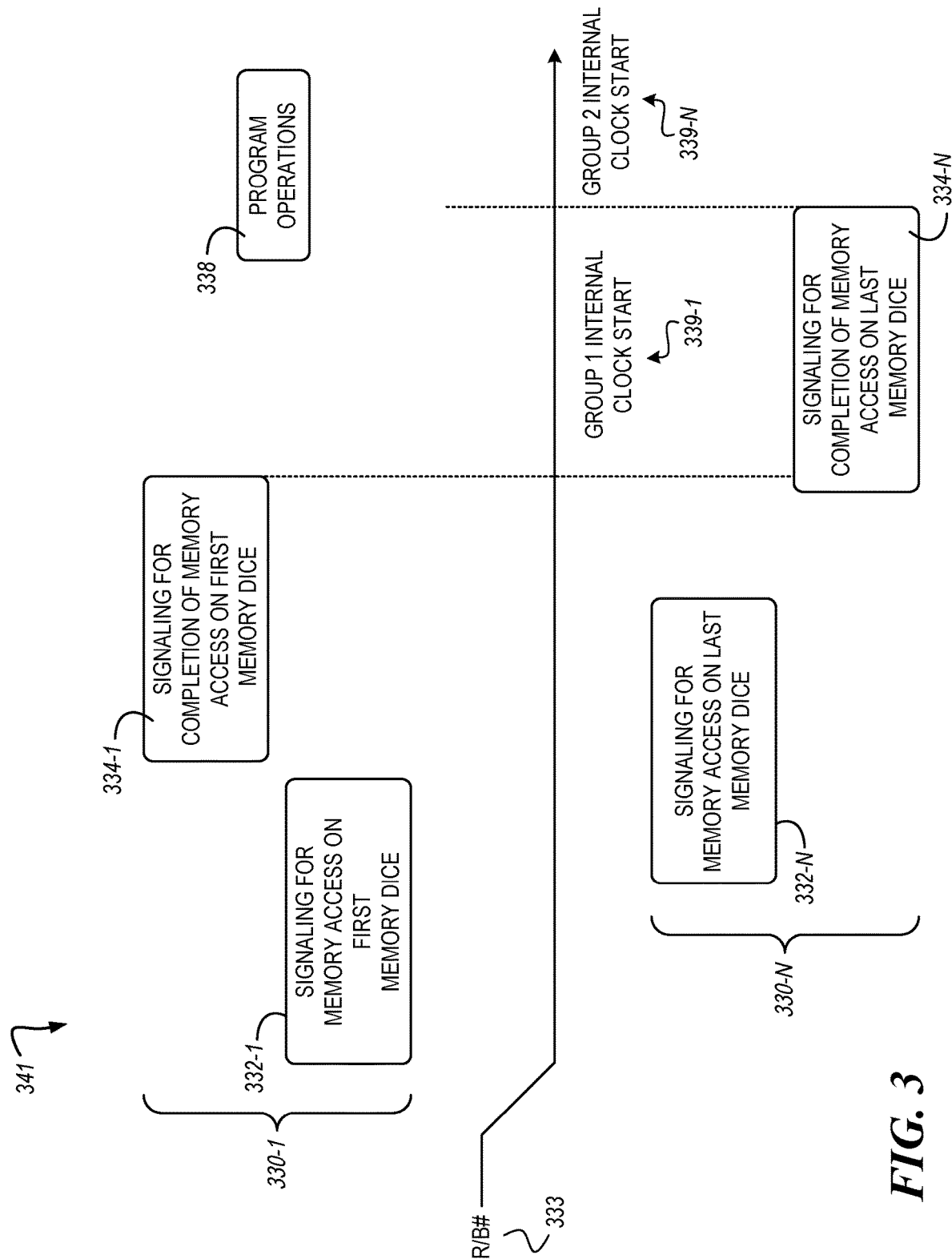
FIG. 3 is a timing diagram corresponding to memory sub-system internal clock signaling in accordance with some embodiments of the present disclosure.

FIG. 3 is a timing diagram 331 corresponding to memory sub-system internal clock signaling in accordance with some embodiments of the present disclosure. Operations as described herein can occur at time stamps illustrated by the dashed lines. In this embodiment, memory dice group 1 330-1 consisting of a plurality of dice (e.g., the memory dice 132-1, 132-2, 132-3 and/or 132-N illustrated in connection with FIG. 1, herein) and associated with a R/B # pin (e.g., the R/B # pins 134-1, 134-2, 134-3 and/or 134-N illustrated in connection with FIG. 1, herein. Memory dice group 2 330-N consisting of a plurality of dice and associated with a R/B # pin. However, embodiments are not so limited, although not illustrated, a plurality of memory dice groups can exist between memory dice group 1 330-1 and memory dice group 2 330-N. A primary R/B # pin 333 can be chosen from the plurality of R/B # pin associated with the plurality of memory dice groups. In some embodiments, when memory access of memory dice group 1 330-1 is complete, the primary R/B # pin 333 can be set to a low power status throughout the peak power management operation. In some embodiments, the memory dice group 1 330-1 and/or the memory dice group 2 330-N can be analogous to the memory dice group 1 231-1 and/or the memory dice group 231-N illustrated in FIG. 2, herein.

At operation 332-1, the processing device (e.g., processor 117 in FIG. 1) can receive, by at least one memory dice among a plurality of memory dice within memory dice group 1 330-1, signaling indicative of performance of a memory access of a first memory dice group 1 330-1 of the plurality of memory dice groups. At operation 332-N, the processing device can receive, by at least one memory dice among a plurality of memory dice within memory dice group 2 330-N, signaling indicative of performance of a memory access of a last memory dice group 2 330-N of the plurality of memory dice groups. In some embodiments, the processing device can simultaneously commence operation of memory dice group 1 330-1 and the memory dice group 2 330-N. In one example, operation 332-1 and operation 332-N can occur concurrently. Signaling indicative of the performance of the memory access for memory dice group 1 330-1 and the memory dice group 2 330-N can be received independently on different physical channels and so memory dice group 1 330-1 and the memory dice group 2 330-N can be configured by the processing device concurrently.

At operation 334-1, the processing device can receive, by at least one memory dice among the plurality of memory dice within memory dice group 1 330-1, signaling indicative of the completion of the performance of the memory access of memory dice group 1 330-1. Although not illustrated, a plurality of memory access operations may occur between operation 332-1 and operation 334-1 within memory dice group 1 330-1. At operation 334-N, the processing device can receive, by at least one memory dice among the plurality of memory dice within memory dice group 2 330-N, signaling indicative of the completion of the performance of the memory access of memory dice group 2 330-N. Although not illustrated, a plurality of memory access operations may occur between operation 332-N and operation 334-N within memory dice group 2 330-N. In an embodiment where memory dice group 1 330-1 and the memory dice group 2 330-N commence operation concurrently, the completion of the memory access of memory dice group 1 330-1 and the memory dice group 2 330-N can occur concurrently thereby causing the initiation of the first internal clocking signal 339-1 and the second clocking signal 339-N concurrently.

At operation 339-1 the processing device can initiate a first internal clocking signal for memory dice group 1 330-1 subsequent to receiving an indication of completion of the performance of the memory access of memory dice group 1 330-1. For example, the processing device can initiate first internal clocking signal for memory dice group 1 330-1 subsequent to operation 334-1. At operation 339-N the processing device can initiate a second internal clocking signal for memory dice group 2 330-N subsequent to receiving an indication of completion of the performance of the memory access of memory dice group 2 330-N. For example, the processing device can initiate second internal clocking signal for memory dice group 2 330-N subsequent to operation 334-N. Although not illustrated, a plurality of internal clocks, corresponding to the number of the plurality of memory dice groups between memory dice group 1 330-1 and memory dice group 2 330-N, may occur between operation 339-1 and operation 339-N. At operation 338, the processing device can resume program operations while the first internal clock and second internal clock have been initiated.

Figure 4:
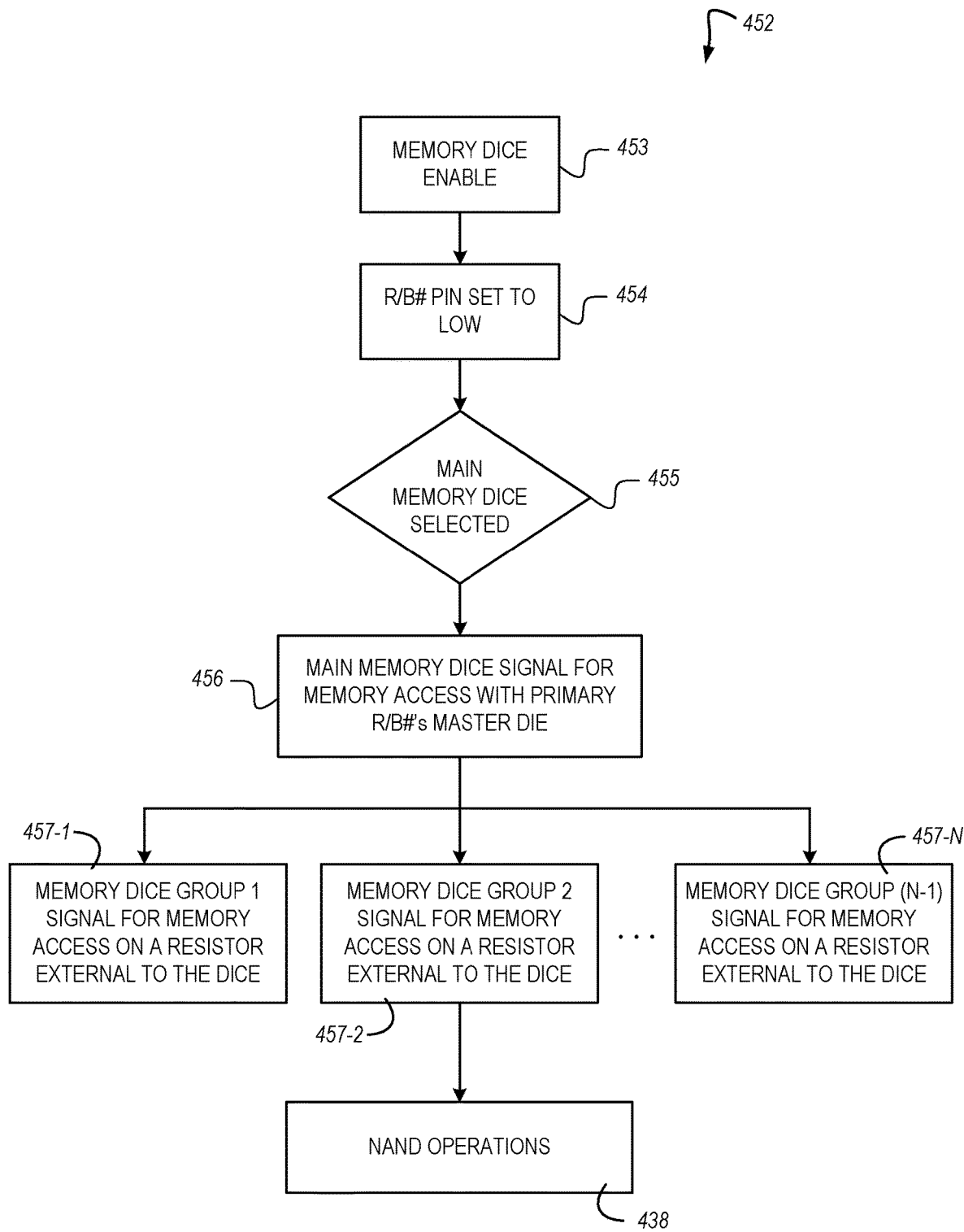
FIG. 4 is a flow diagram corresponding to memory sub-system internal clock signaling in accordance with some embodiments of the present disclosure.

FIG. 4 is a flow diagram 431 corresponding to memory sub-system internal clock signaling in accordance with some embodiments of the present disclosure. At operation 453, the memory dice are enabled to perform a peak power management operation. The memory dice can be analogous to the memory dice 132-1 to 132-N illustrated in FIG. 1, herein. At operation 454, at least one R/B # pin (e.g., at least one of the R/B # pins 134-1 to 134-N illustrated in FIG. 1) is set to LOW in order to perform the peak power management operation. As described above, when the R/B # pin is set to HIGH, performance of memory accesses involving the memory dice may be paused.

At operation 455, a main memory dice (e.g., the memory dice 132-1 illustrated in FIG. 1, herein) is selected from the plurality of memory dice. The main memory dice will be associated with the primary R/B # pin (e.g., the R/B # pin 134-1 illustrated in FIG. 1, herein). Although associated with each other, they can function independently. For example, signaling indicative of performance of the memory access for the memory dice and the plurality of R/B # pins can be received exclusive of the other. The memory sub-system can access the main memory dice prior to accessing the plurality of memory dice associated with the plurality of R/B # pins. For example, at operation 456, the main memory dice can generate a signal indicating performance of a memory access involving the main memory dice prior to the plurality of memory dice generating signals indicating performance of memory accesses as reflected in operation 457-1, 457-2 to 457-N. The memory dice groups can be accessed at the same time by the memory sub-system on different channels. The memory dice groups can also be enabled or disabled independently. The main memory dice can provide internal instruction to the plurality of memory dice. For example, the plurality of memory dice can rely on instruction from the main memory dice to decide when to initiate or disable the peak power management operation. At operation 438, the memory sub-system can resume performance of, for example, NAND operations while the first internal clock and second internal clock have been initiated.

Figure 5:
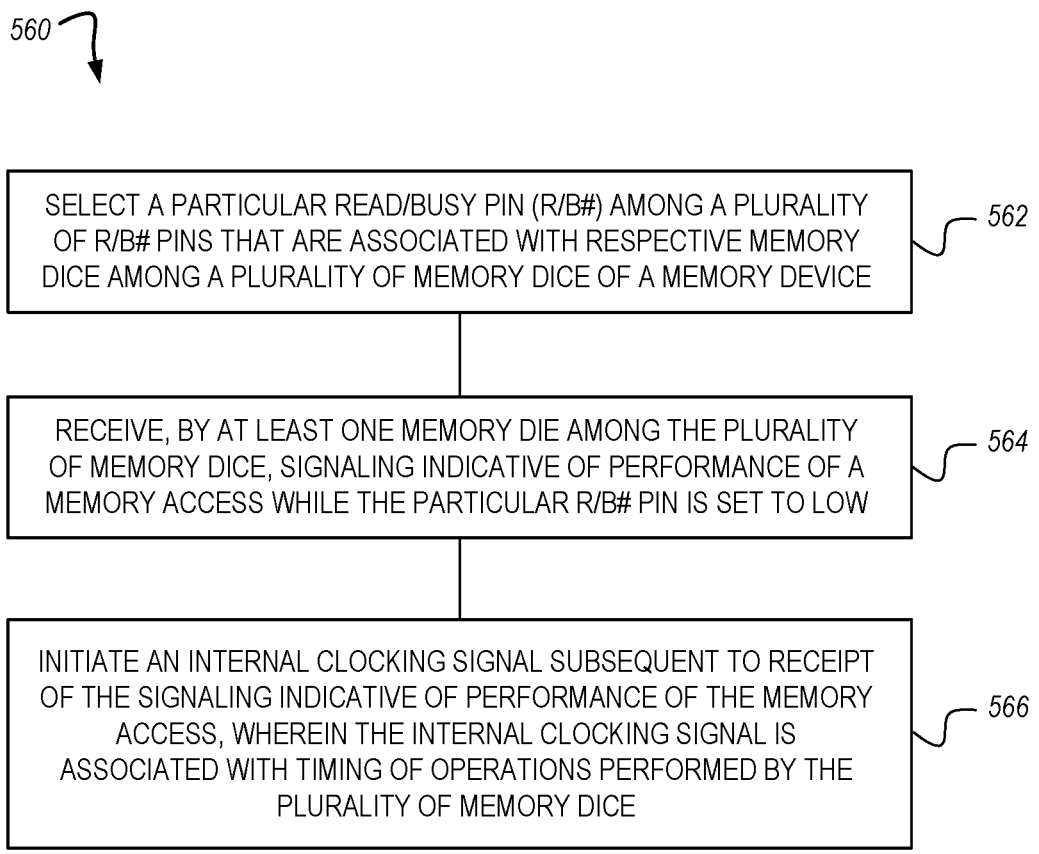
FIG. 5 is a flow diagram corresponding to a method for memory sub-system internal clock signaling in accordance with some embodiments of the present disclosure.

FIG. 5 is flow diagram corresponding to a method 560 for memory sub-system internal clock signaling in accordance with some embodiments of the present disclosure. The method 560 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 560 is performed by the processing device and/or the memory access control component of the memory sub-system as part of a peak power management operation. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 562, a particular read/busy pin (R/B #) among a plurality of R/B # pins that are associated with respective memory dice among a plurality of memory dice of a memory sub-system can be selected. In some embodiments, the memory sub-system can be analogous to the memory sub-system 110 illustrated in FIG. 1. As described above, a primary R/B # pin of a plurality of R/B # pins may be selected. Each respective R/B # pin can be associated with a memory dice of a plurality of memory dice within a memory sub-system.

At operation 564, signaling indicative of performance of a memory access can be received from at least one memory dice among the plurality of memory dice, while the particular R/B # pin is set to low. The primary R/B # pin is associated with a particular memory dice of the plurality of memory dice. When the primary R/B # pin is set to low, memory access of the particular memory dice can occur and a signal indicative of the performance of the memory access can be received.

At operation 566, an internal clocking signal can be initiated subsequent to receipt of the signaling indicative of performance of the memory access, wherein the internal clocking signal is associated with timing of operations performed by the plurality of memory dice. The internal clocking signal can be received subsequent to the completion of the performance of the memory access of the plurality of memory dice or subsequent to the completion of the performance of the memory access of the particular memory dice to which the internal clock is assigned.

Figure 6:
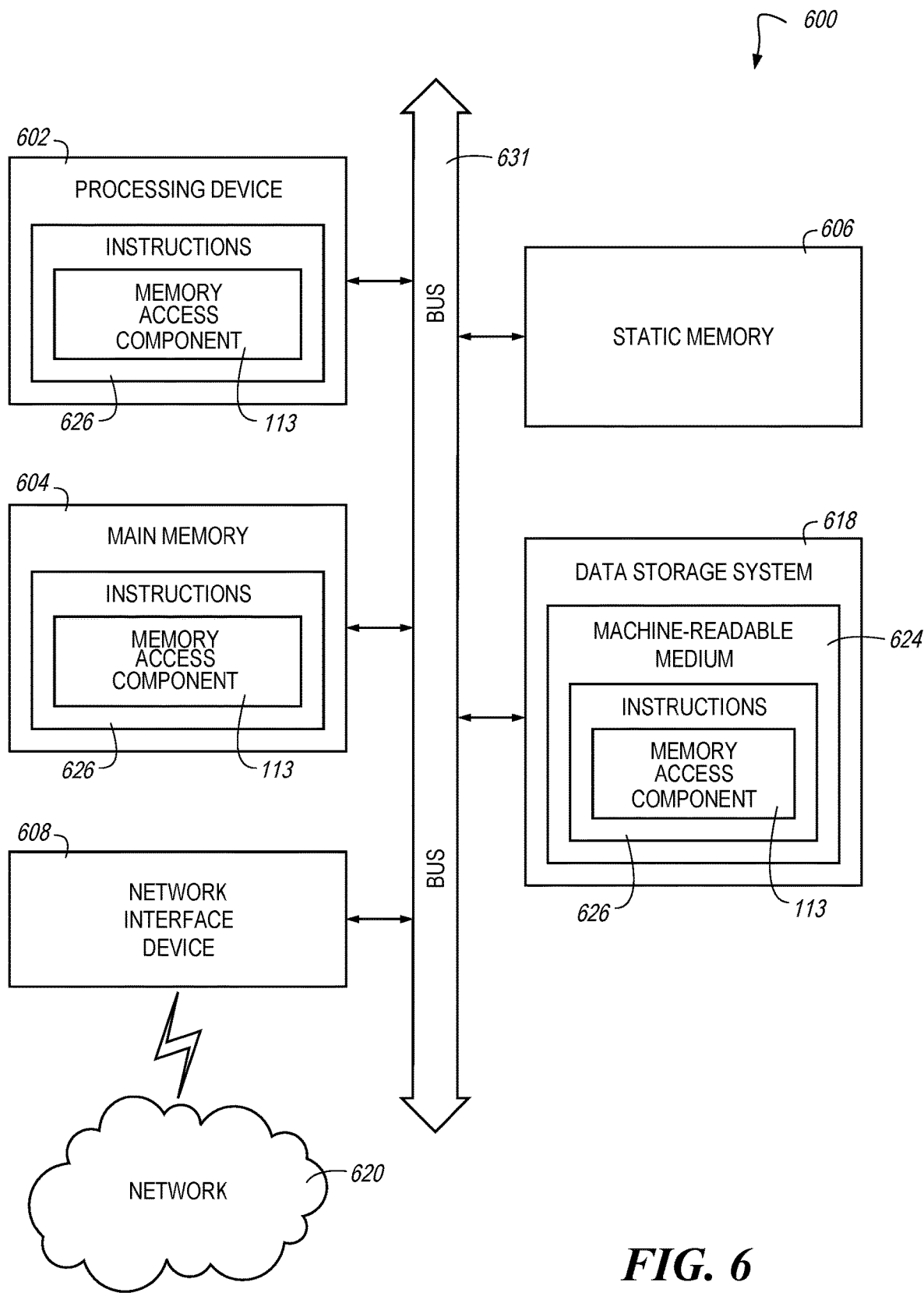
FIG. 6 is a block diagram of an example computer system in which embodiments of the present disclosure may operate.

FIG. 6 is a block diagram of an example computer system 600 in which embodiments of the present disclosure may operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory access control component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 631.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a memory access control component (e.g., the memory access control component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   selecting a primary ready/busy pin (R/B #) among a plurality of R/B # pins that are associated with respective memory dice among a plurality of memory dice groups of a memory device;
   setting the primary R/B # pin to a first status;
   receiving by at least one memory die among a plurality of memory dice within a first memory dice group, signaling indicative of performance of a memory access of the first memory dice group of the plurality of memory dice groups;
   receiving, by the at least one memory die among a plurality of memory dice within a second memory dice group, signaling indicative of performance of the memory access involving the second memory dice group among the plurality of memory dice groups; and
   concurrently initiating a first internal clocking signal and a second internal clocking signal subsequent to receipt of signaling indicative of completion of the performance of the memory access of the first memory dice group and the second memory dice group among the plurality of memory dice groups, wherein the concurrently initiated first internal clocking signal and the second internal clocking signal are associated with timing of operations performed by the plurality of memory dice groups.

2. The method of claim 1 further comprising: using different physical channels to receive the signaling indicative of performance of the memory access of the first memory dice group and memory access of the second memory dice group.

3. The method of claim 2, wherein operations of the first memory dice group and the second memory dice group are configured concurrently by a processing device via the different physical channels.

4. The method of claim 1, wherein the completion of the performance of the memory access of the first memory dice group and the second memory dice group occurs concurrently.

5. The method of claim 1 further comprising: resuming program operations while the first internal clocking signal and the second internal clocking signal have been initiated.

6. The method of claim 1 further comprising: setting the primary R/B # pin from the first status to a second status; and in response to the setting of the primary R/B # pin to the second status, pausing the performance of the memory access of the first memory dice group and the second memory dice group.

7. The method of claim 6, wherein the second status is a high status, and wherein the primary R/B # pin is set to the high status upon completion of the performance of the memory access of the first memory dice group and the second memory dice group.

8. The method of claim 1, wherein the selecting, receiving, and initiating are performed as part of a peak power management operation involving the plurality of memory dice groups.

9. A non-transitory computer-readable storage medium comprising instructions that, when executed by a processor, cause the processor to:
   select a primary ready/busy pin (R/B #) among a plurality of R/B # pins that are associated with respective memory dice among a plurality of memory dice groups of a memory device;
   set the primary R/B # pin to a particular status;
   receive by at least one memory die among a plurality of memory dice within a first memory dice group, signaling indicative of performance of a memory access of the first memory dice group of the plurality of memory dice groups;
   receive, by the at least one memory die among a plurality of memory dice within a second memory dice group, signaling indicative of performance of the memory access involving the second memory dice group among the plurality of memory dice groups; and
   concurrently initiate a first internal clocking signal and a second internal clocking signal subsequent to receipt of signaling indicative of completion of the performance of the memory access of the first memory dice group and the second memory dice group among the plurality of memory dice groups, wherein the concurrently initiated first internal clocking signal and the second internal clocking signal are associated with timing of operations performed by the plurality of memory dice groups.

10. The non-transitory computer-readable storage medium of claim 9, wherein the instructions, when executed, further cause the processor to use different independent channels to receive the signaling indicative of performance of the memory access of the first memory dice group and memory access of the second memory dice group.

11. The non-transitory computer-readable storage medium of claim 10, wherein operations of the first memory dice group and the second memory dice group are configured concurrently by a processing device via the different independent channels.

12. The non-transitory computer-readable storage medium of claim 9, wherein completion of the performance of the memory access of the first memory dice group and the second memory dice group occurs concurrently.

13. The non-transitory computer-readable storage medium of claim 9, wherein the primary R/B # pin is associated with a main memory die among a plurality of memory dice groups.

14. The non-transitory computer-readable storage medium of claim 9, wherein the particular status is a low status, and wherein the instructions, when executed, further cause the processor to set the primary R/B # pin from the low status to a high status; and in response to the setting of the primary R/B # pin to high status, pausing the performance of the memory access of the first memory dice group and the second memory dice group.

15. The non-transitory computer-readable storage medium of claim 14, wherein the primary R/B # pin is set to the high status upon completion of the performance of the memory access of the first memory dice group and the second memory dice group.

16. A system, comprising:
    a plurality of memory dice groups that share a peak power characteristic, wherein each memory die of the plurality of memory dice groups is associated with a ready/busy pin (R/B #) among a plurality of R/B # pins; and a processor operatively coupled to the plurality of memory dice groups, to:
- select a primary ready/busy pin (R/B #) among the plurality of R/B # pins;
- set the primary R/B # pin to a low status;
- receive by at least one memory die among a plurality of memory dice within a first memory dice group, signaling indicative of performance of a memory access of the first memory dice group of the plurality of memory dice groups;
- receive, by the at least one memory die among a plurality of memory dice within a second memory dice group, signaling indicative of performance of the memory access involving the second memory dice group among the plurality of memory dice groups; and
- concurrently initiate a first internal clocking signal and a second internal clocking signal subsequent to receipt of signaling indicative of completion of the performance of the memory access of the first memory dice group and the second dice memory group among the plurality of memory dice groups, wherein the concurrently initiated first internal clocking signal and the second internal clocking signal are associated with timing of operations performed by the plurality of memory dice groups.

17. The system of claim 16, wherein the first internal clocking signal and the second internal clocking signal are initiated only responsive to the primary R/B # pin being set to low status.

18. The system of claim 16, wherein the processor configures concurrently the operations of the first memory dice group and the second memory dice group using different and independent physical channels.

19. The system of claim 16, wherein completion of the performance of the memory access of the first memory dice group and the second memory dice group occurs concurrently.

20. The system of claim 16, wherein the processor to resume program operations while the first internal clocking signal and the second internal clocking signal have been initiated.

* * * * *